United States Patent
Chung et al.

(10) Patent No.: US 7,633,288 B2
(45) Date of Patent: Dec. 15, 2009

(54) METHOD OF TESTING SEMICONDUCTOR DEVICES AND HANDLER USED FOR TESTING SEMICONDUCTOR DEVICES

(75) Inventors: Ae-Yong Chung, Cheonan-si (KR); Eun-Seok Lee, Asan-si (KR); Ki-Sang Kang, Yongin-si (KR); Kyeong-Seon Shin, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 219 days.

(21) Appl. No.: 11/527,378

(22) Filed: Sep. 27, 2006

(65) Prior Publication Data
US 2007/0075719 A1 Apr. 5, 2007

(30) Foreign Application Priority Data
Sep. 30, 2005 (KR) .................. 10-2005-0092152

(51) Int. Cl.
*G01R 31/28* (2006.01)
*G01R 31/26* (2006.01)

(52) U.S. Cl. .................. 324/158.1; 324/765

(58) Field of Classification Search .......... None
See application file for complete search history.

(56) References Cited

U.S. PATENT DOCUMENTS

| | | | | |
|---|---|---|---|---|
| 5,589,765 A | * | 12/1996 | Ohmart et al. | 324/158.1 |
| 5,805,472 A | * | 9/1998 | Fukasawa | 702/118 |
| 6,314,332 B1 | * | 11/2001 | Kida | 700/113 |
| 6,433,294 B1 | | 8/2002 | Nemoto | |
| 6,563,331 B1 | * | 5/2003 | Maeng | 324/760 |
| 7,333,016 B2 | * | 2/2008 | Ancel | 340/572.1 |

FOREIGN PATENT DOCUMENTS

KR 1020040032318 A 10/2002
KR 10-2005-0092152 9/2006

OTHER PUBLICATIONS

Office Action for Corresponding Korean Application No. 10-2005-0092152 dated Sep. 18, 2006 and English translation thereof.

* cited by examiner

*Primary Examiner*—Ha Tran T Nguyen
*Assistant Examiner*—Roberto Velez
(74) *Attorney, Agent, or Firm*—Harness, Dickey & Pierce

(57) ABSTRACT

Example embodiments may provide a method of testing semiconductor devices by identifying units of lots and a test tray such that a plurality of lots having semiconductor devices may be continuously tested by a handler. Example embodiments may also provide a handler used to test the semiconductor devices.

11 Claims, 11 Drawing Sheets

METHOD OF TESTING SEMICONDUCTOR DEVICES AND HANDLER USED FOR TESTING SEMICONDUCTOR DEVICES

PRIORITY CLAIM

A claim of priority is made to Korean Patent Application No. 10-2005-0092152, filed on Sep. 30, 2005, in the Korean Intellectual Property Office, the disclosure of which is incorporated herein in its entirety by reference.

BACKGROUND

1. Field

Example embodiments may relate to a method of testing semiconductor devices. More particularly, example embodiments may relate to a method of testing semiconductor devices by identifying units of lots and a test tray such that a plurality of lots having the semiconductor devices may be continuously tested by a handler.

2. Description of the Related Art

A handler may be used to electrically test semiconductor devices. A handler may be an automatic testing robot, which may be electrically connected to a tester. The handler may connect semiconductor devices to the tester, perform electrical tests, and sort the semiconductor devices according to electrical test results.

The handler may use a carrier, for example, a tray to convey the semiconductor devices. The tray may have a structure configured so that a plurality of semiconductor devices may be inserted in a matrix. The tray may be a customer tray used for transportation and storage, or a test tray for connecting to the tester.

FIG. 1 is a block diagram of a handler according to the conventional art. Referring to FIG. 1, a handler 50 may include a test front area 10 having a customer tray 16 and a test chamber 30. Semiconductor devices may move in the direction indicated by arrows while in the customer tray so that electrical testing may be performed in the handler 50.

Semiconductor devices may be inserted in units of lots into a first customer tray 16 of a loading portion 12 of the test front area 10. The semiconductor devices may be conveyed from the customer tray 16 to a test tray 20 so as to electrically test the semiconductor devices at a tray-conveying site 18 of the loading portion 12.

The semiconductor devices may be conveyed to a soak portion 32 where various temperatures may be applied to the semiconductor devices. The temperatures at the soak portion 32 may include room temperature, and temperatures lower and higher than room temperature. The semiconductor devices may be conveyed to a test portion 36. The semiconductor devices may be connected to a tester for electrical testing.

The semiconductor devices may be conveyed to a sorting portion 38, inserted into a second customer tray 25, and sorted according to test results into defective semiconductor devices 26 and non-defective semiconductor devices 24. The sorted semiconductor devices may be removed at an unloading portion 22 of the handler 50.

FIG. 2 is a flowchart illustrating a method of electrically testing a semiconductor device with a handler connected to a tester according to the conventional art. Referring to FIG. 2, a test program may be loaded onto a tester in operation T10. The tester and the handler may be electrically connected to each other. In order to start electrical testing on the semiconductor devices, the semiconductor devices in units of lots may be input (e.g., loaded) to a customer tray of the handler in operation H10. The semiconductor devices in the customer tray may be conveyed to a test tray in operation H12. The semiconductor devices may be connected to the tester in operation H14, and an electrical test starting signal may be applied to the tester.

The tester may start to perform an electrical test on the semiconductor devices in response to an electrical test starting signal in operation T12, and when the electrical test is completed in operation T14, an electrical test result bin containing the semiconductor devices may be transmitted to the handler in operation T16. Because only one lot may be electrically tested inside the handler, test results of the devices under test (DUT) need not to be separately converted.

The handler sorts the DUT in each bin according to the test results in operation H16. If an electrical test on a DUT is completed, operations of connecting the tester to another DUT (H14'), starting another electrical test (T12'), finishing another test (T14'), and sorting another DUT in the handler (H16') after transmitting the test results from the tester (T16') may be repeatedly performed in operation H17.

When the last DUT included in a lot is sorted (H18) and unloading (H20) of a last DUT is finished, the lots may be unloaded (H22) from the handler, thus finishing the electrical test on the loaded lot. The next lot may be loaded (H28), and the above process may be repeated on the next lot (H30).

FIG. 3 is a flowchart illustrating a method of electrically testing a plurality of lots using a handler and a tester according to the conventional art. Referring to FIG. 3, a first lot may be supplied to a handler in operation S10. An electrical test may be performed on the first lot in operation S20. When the electrical test is finished, the first lot may be unloaded from the handler in operation S30. Afterwards, a second lot may be supplied to the handler in operation S40, tested in operation S50, and unloaded in operation S60, thus completing the electrical test on the first lot.

In the method of electrically testing semiconductor devices according to the conventional art, the semiconductor devices may be input to or output from the handler in units of lots. In general, the tester may perform an electrical test on the semiconductor devices by generating an electrical signal, and the handler may physically process the semiconductor devices inserted in trays. However, only one lot may be supplied from the handler, and the tester may not operate while the handler is physically processing, for example, loading and uploading the semiconductor devices. Accordingly, the tester may not be efficiently used due to the down times.

In general, it may take up to about 800 seconds to load and unload one lot in a handler. Because a tester may not operate during this time, the efficiency of a test system including the handler and the tester may be limited.

SUMMARY

Example embodiments may provide a method of testing semiconductor devices by identifying units of lots and a test tray such that a plurality of lots having semiconductor devices may be continuously tested by a handler. Example embodiments may also provide a handler used to test the semiconductor devices.

In an example embodiment, a method of testing semiconductor devices may include loading a plurality of semiconductor device in units of lots to a handler, conveying a first lot of the plurality of semiconductor devices to a test tray, reading identification information of the first lot to store the identification information in the handler, transmitting the identification information to an external server, performing an electrical test on the first lot using the identification information stored in the handler, receiving identification information from the external server and converting test results, sorting and loading the tested semiconductor devices of the first lot based on the converted test results, and performing the electrical test on a second lot of the plurality of semiconductor devices.

In another example embodiment, a handler used to test semiconductor devices may include a loader portion having a loading space configured to receive a plurality of semiconductor devices in units of lots, and having a tray-conveying site including an first identification portion configured to read identification information and configured to convey the plurality of semiconductor devices to a test tray, a test portion configured to receive the plurality of semiconductor devices, and configured to test the plurality of semiconductor devices, a sorting portion configured to sort the plurality of semiconductor devices based on a test results, and an unloading portion including a plurality of sites, each of the plurality of sites configured to receive corresponding tested semiconductor devices, and an abnormal site configured to hold defective semiconductor devices for retesting.

BRIEF DESCRIPTION OF THE DRAWINGS

Example embodiments may become more apparent with the description with reference to the attached drawings in which.

DETAILED DESCRIPTION OF EXAMPLE EMBODIMENTS

Figure 1:
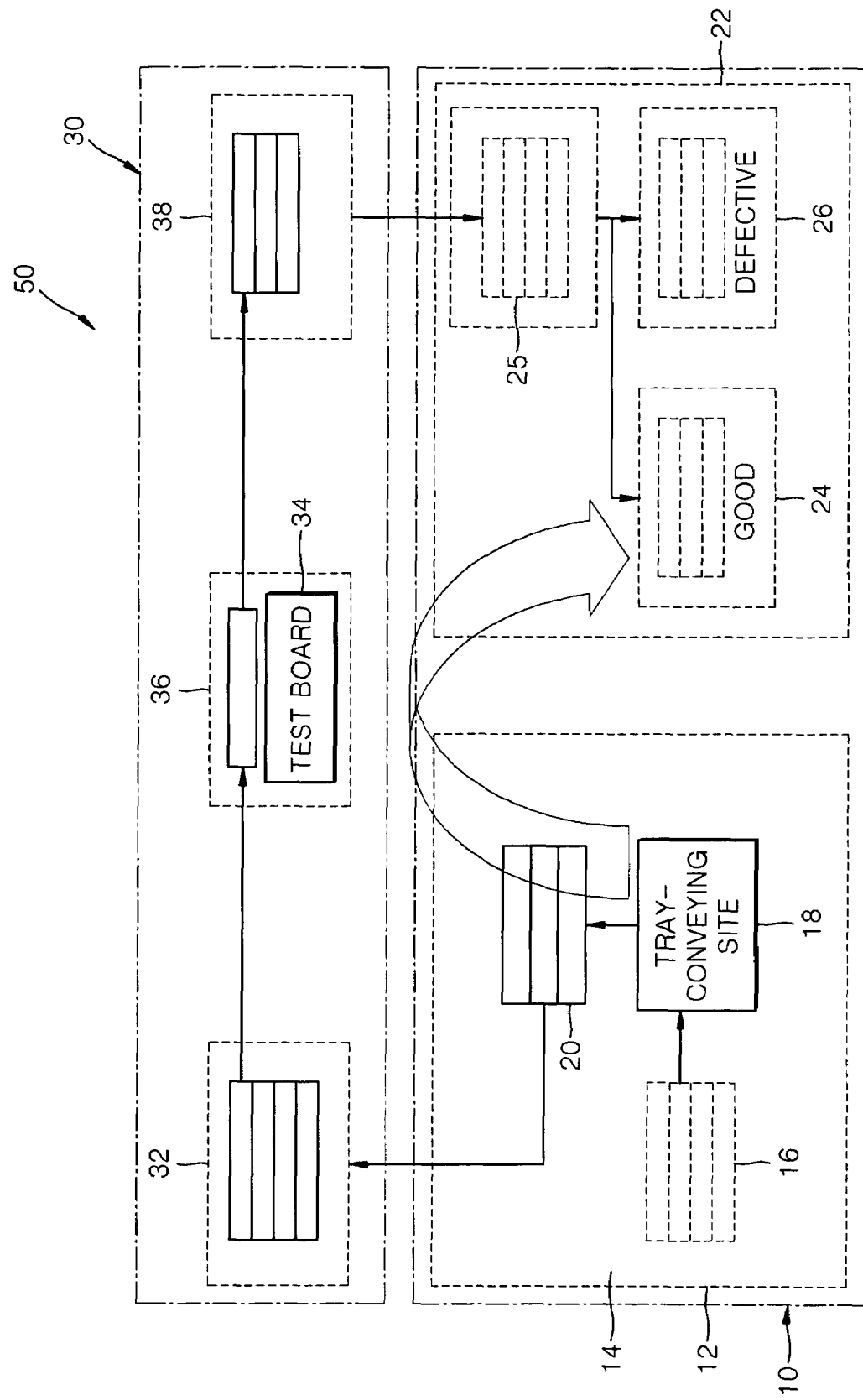
FIG. 1 is a block diagram of a handler according to the conventional art.
Figure 2:
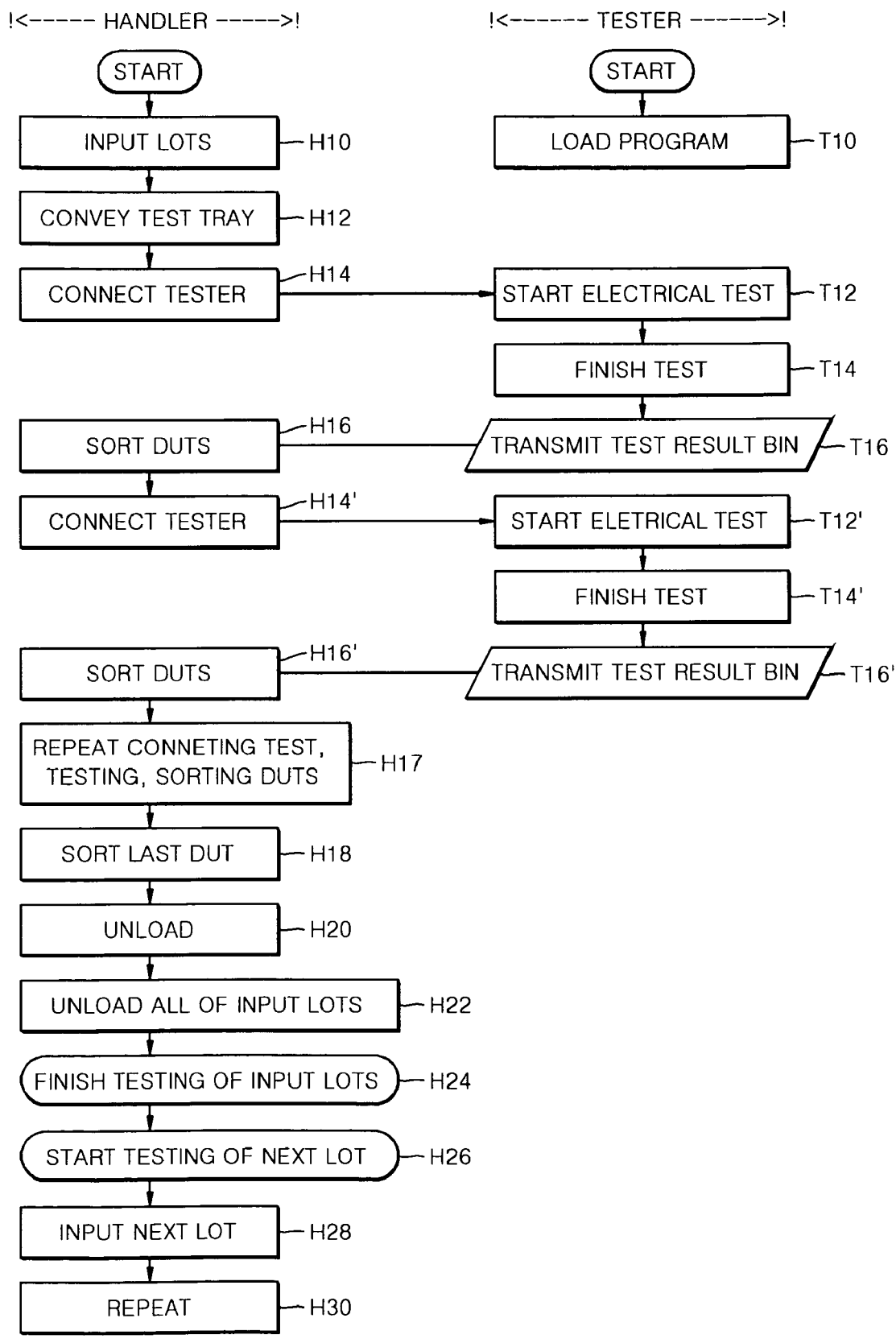
FIG. 2 is a flowchart illustrating a method of electrically testing a semiconductor device with a handler connected to a tester according to the conventional art.
Figure 3:
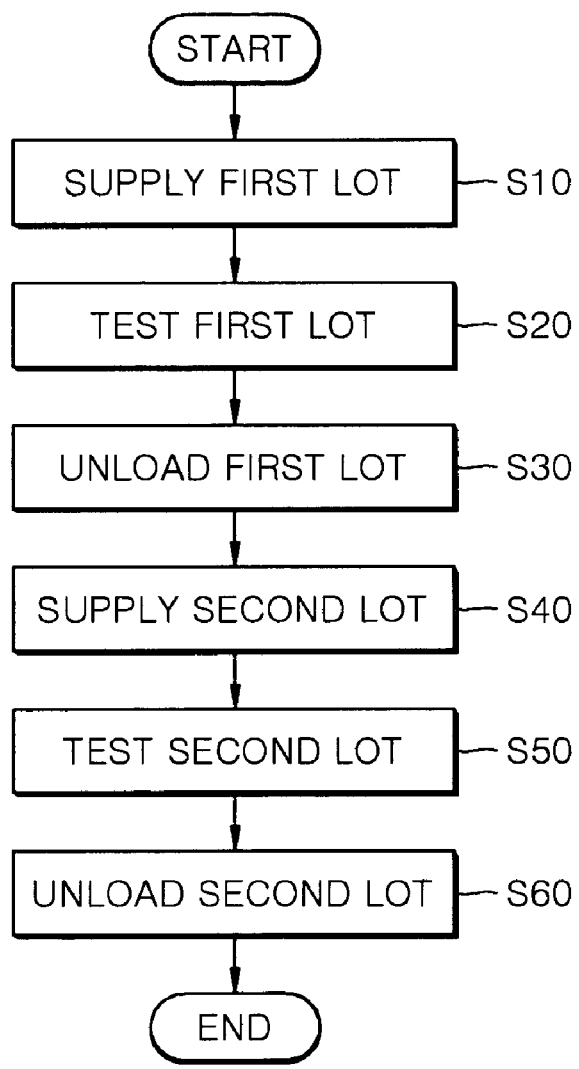
FIG. 3 is a flowchart illustrating a method of electrically testing a plurality of lots according to the conventional art.

Example embodiments will now be described more fully with reference to the accompanying drawings. Example embodiments may, however, be embodied in many different forms and should not be construed as being limited to the example embodiments set forth herein; rather, these example embodiments may be considered as working examples.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
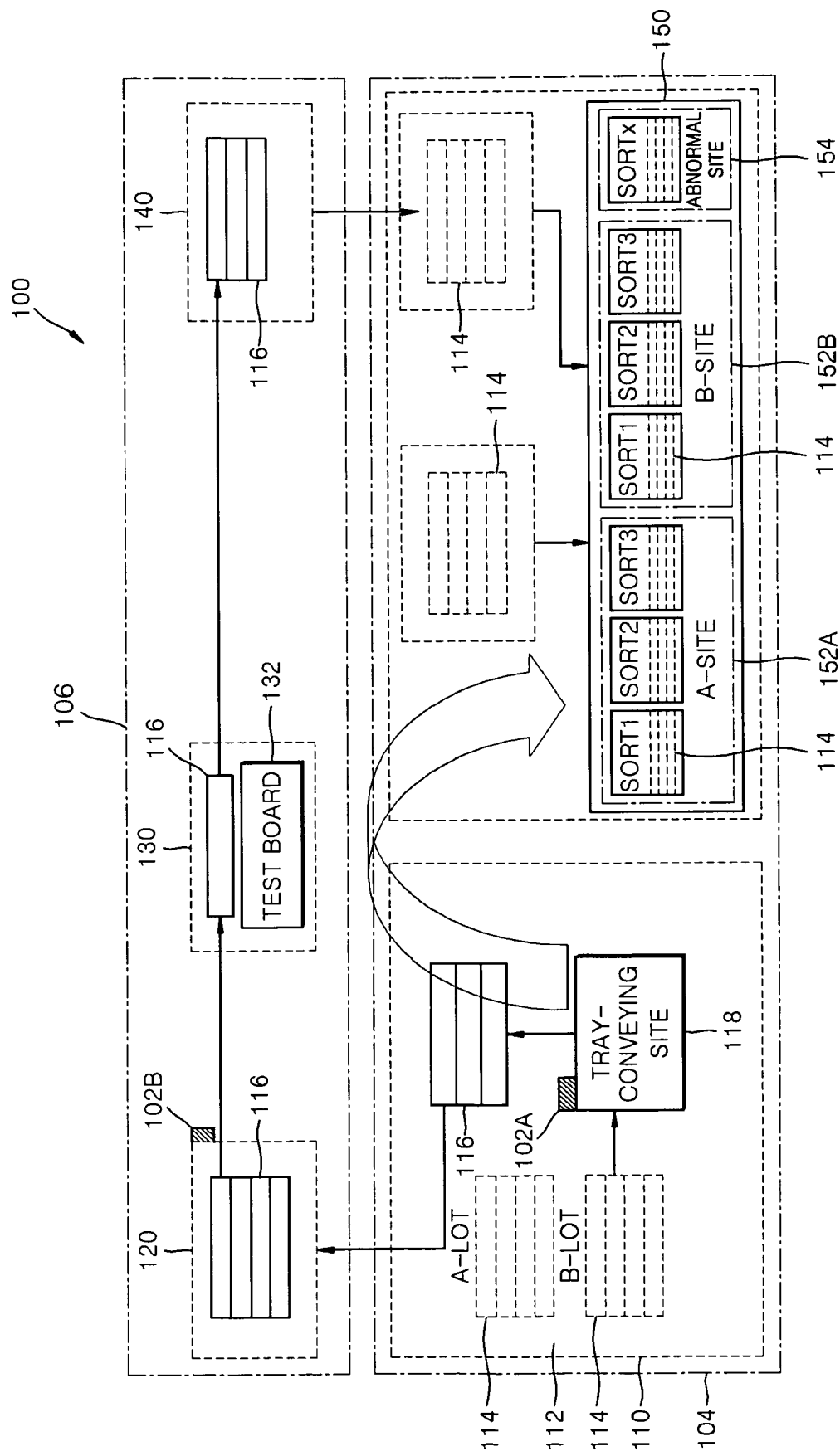
FIG. 4 is a block diagram of a handler according to an example embodiment.

FIG. 4 is a block diagram of a handler according to an example embodiment. Referring to FIG. 4, a handler 100 may include a test front area 104 and a test chamber 106. Semiconductor devices in a customer tray 114 or a test tray 116 may move in a direction indicated by arrows to perform an electrical test inside the handler 100.

The handler 100 may further include a loader portion 110 having a receiving space 112 in which two or more lots of semiconductor devices may be received, and a tray-conveying site 118 in which the input (loaded) lots of semiconductor devices may be conveyed from the customer tray 114 to the test tray 116. In other words, the handler 100 may include a receiving space 112 in which not only one, but at least two lots may be received. A first identification portion 102A, which may be located on the tray-conveying site 118, to read identification information of the test tray 116. The first identification portion 102A or a second identification 102A may be a bar-code recognizer, a sensor, or a radio frequency identification (RFID) device. One end of the test tray 116 may include identification information to be read by the first identification portion 102A.

In addition, the handler 100 may further include a soak portion 120 which may apply various temperatures to the semiconductor devices conveyed by the test tray 116. A second identification portion 102B may additionally be located in the soak portion 120. The semiconductor devices in the test tray 116 may be conveyed out of the soak portion 120 to a test portion 130. The semiconductor devices may be connected to a test board 132 of the tester, which may perform an electrical test on the semiconductor devices.

The handler 100 may further include a sorting portion 140 which may sort the semiconductor devices tested by the test portion 130, and an unloading portion 150 which convey the sorted semiconductor devices to a plurality of receiving spaces in units of lots. When the semiconductor devices are conveyed to the unloading portion 150 from the sorting portion 140, the semiconductor device may be in the test tray 116 or the customer tray 114. The unloading portion 150 may include spaces 152A and 152B in which a first lot and a second lot, respectively, may be sorted and unloaded.

Figure 5:
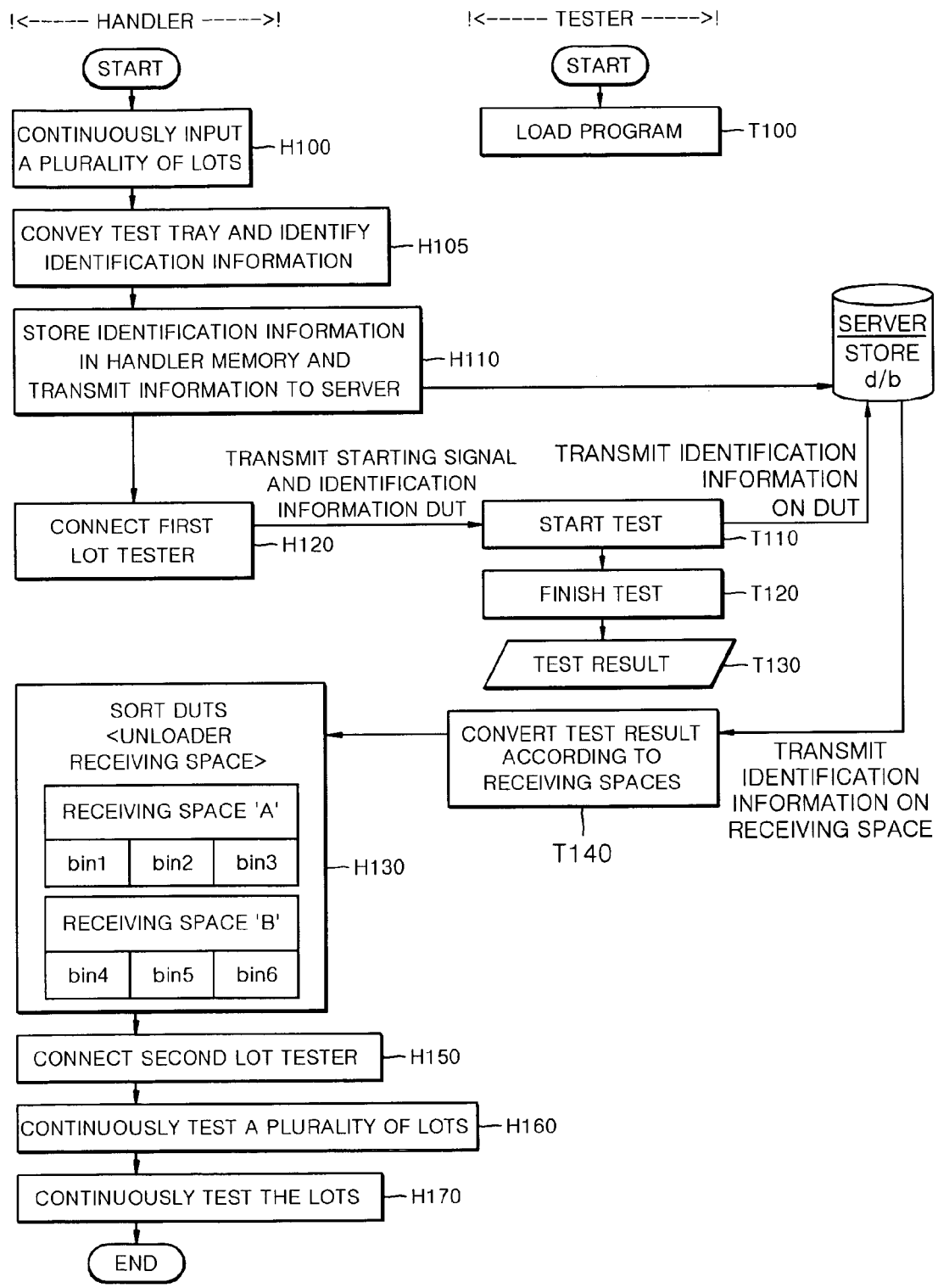
FIG. 5 is a flowchart illustrating a method of electrically testing semiconductor devices according to an example embodiment.

FIG. 5 is a flowchart illustrating a method of electrically testing semiconductor devices according to an example embodiment. Referring to FIG. 5, a program for testing semiconductor devices may be loaded on a tester in operation T100. A plurality of lots (semiconductor devices) may be continuously input (loaded) to the handler in operation H100.

The semiconductor devices included in the customer tray may be conveyed to a test tray at a tray-conveying site in a loading portion of the handler, and identification information of the test tray may be read by an identification portion located in the tray-conveying site in operation H105. The identification information may include information shown in Table 1, which is presented only as an example.

TABLE 1

| LOT-id | Test tray-Id | Receiving space-Id | Numbers | Conveying time |
|---|---|---|---|---|
| Lot-1 | T-Tray#1 | a-stock | 128 | 05.06.01.22:00:00 |
|  | T-Tray#2 | a-stock | 128 | 05.06.01.22:01:00 |
|  | T-Tray#3 | a-stock | 64 | 05.06.01.22:02:00 |

TABLE 1-continued

| LOT-id | Test tray-Id | Receiving space-Id | Numbers | Conveying time |
|---|---|---|---|---|
| Lot-2 | T-Tray#4 | b-stock | 128 | 05.06.01.22:03:00 |
|  | T-Tray#5 | b-stock | 128 | 05.06.01.22:04:00 |
|  | T-Tray#6 | b-stock | 32 | 05.06.01.22:05:00 |

The identification information may include information regarding the number of test trays: T-Tray#1 to T-Tray#6 for each lot (lot-1 or lot-2); the number of receiving spaces for each lot (a-stock or b-stock); the number of semiconductor devices in each lot; and conveying time of the semiconductor devices from the customer tray to the test tray.

The identification information may be stored in a memory of the handler and may be transmitted to a server in operation H110. In example embodiments, the identification information may be processed by an external server.

When processing the identification information using a handler according to the conventional art, hardware, for example, a central processing unit (CPU) or a memory device must be located in a handler. Therefore, it is very difficult to handle/utilize the identification information using the handler according to the conventional art. However, Because the identification information is handled by a CPU of an external server, the identification information may be handled and utilized even if additional hardware is not located in a handler. Thus, the handler may generate only raw data on the identification information using the identification portion located internally of the handler, whereas the CPU of the external server utilizes and handles raw data.

Various temperatures may be applied to the semiconductor devices in the test tray for a desired amount of time while the test tray is in a soak portion. The handler may convey the test tray from the soak portion to a test portion to connect the test tray to the tester. The handler may transmit to the tester a test signal and identification information of the test tray connected to the tester in operation H120. The tester may receive the identification information, perform an electrical test on the semiconductor devices, and transmit to the external server the identification information of a device under test (DUT) in operation T110. The identification information may include both the identification information shown in Table 1 and the information regarding the DUT. The electrical test on the DUT may be completed in operation T120, and the test result may be externally output in operation T130.

The tester may convert the test results using the identification information of the DUT received from the external server in operation T140. In order to convert the test results, lots received in the receiving spaces (a stock and b stock) of the handler may be designated as a first lot and a second lot. A desired value may be added to the test results of the first lot or the second lot. The desired value may be a maximum value of bin data used to sort the semiconductor devices in the test program loaded on the tester in operation T100.

For example, if the number of maximum values of the bin data in the test program to designate the test result is 3, bin 1 to 3 in the handler may be used for the first lot, and bin 1 for the second lot is bin 4 to which 3 is added to the bin 1, bin 2 is bin 5, and bin 3 is bin 6. The test result may be converted by this method because the handler according to the conventional art may be designed to be suitable for only one lot. However, in the handler according to the conventional art, the number of bins may be 10-20, and the number of used bins may be less than 10. Thus, bin in the handler may be more effectively used by converting the test results. According to a current configuration of the handler, a plurality of lots may not be sorted, but, according to the above converting method, the test results for the plurality of lots may be sorted without any problem.

The handler may substantially perform a sorting operation using the converted test results received from the tester in operation H130. After the first lot is tested in the test portion, the handler may convey the second lot to the soak portion, and when testing of the first lot is completed, the second lot (H150) may be subsequently tested without idle time delay in operation H160. As such, problems associated with the conventional art may be solved, and thus, the operating efficiency of the tester may be improved.

In addition, after the electrical test on the second lot is completed, defective semiconductor devices of the first lot and defective semiconductor devices of the second lot may be returned to the loading portion of the handler so that retest of the defective semiconductor devices may be performed in operation H170. Thus, even if a retest is performed at the handler, semiconductor devices of two lots may be tested without being mixed with each other.

Figure 6:
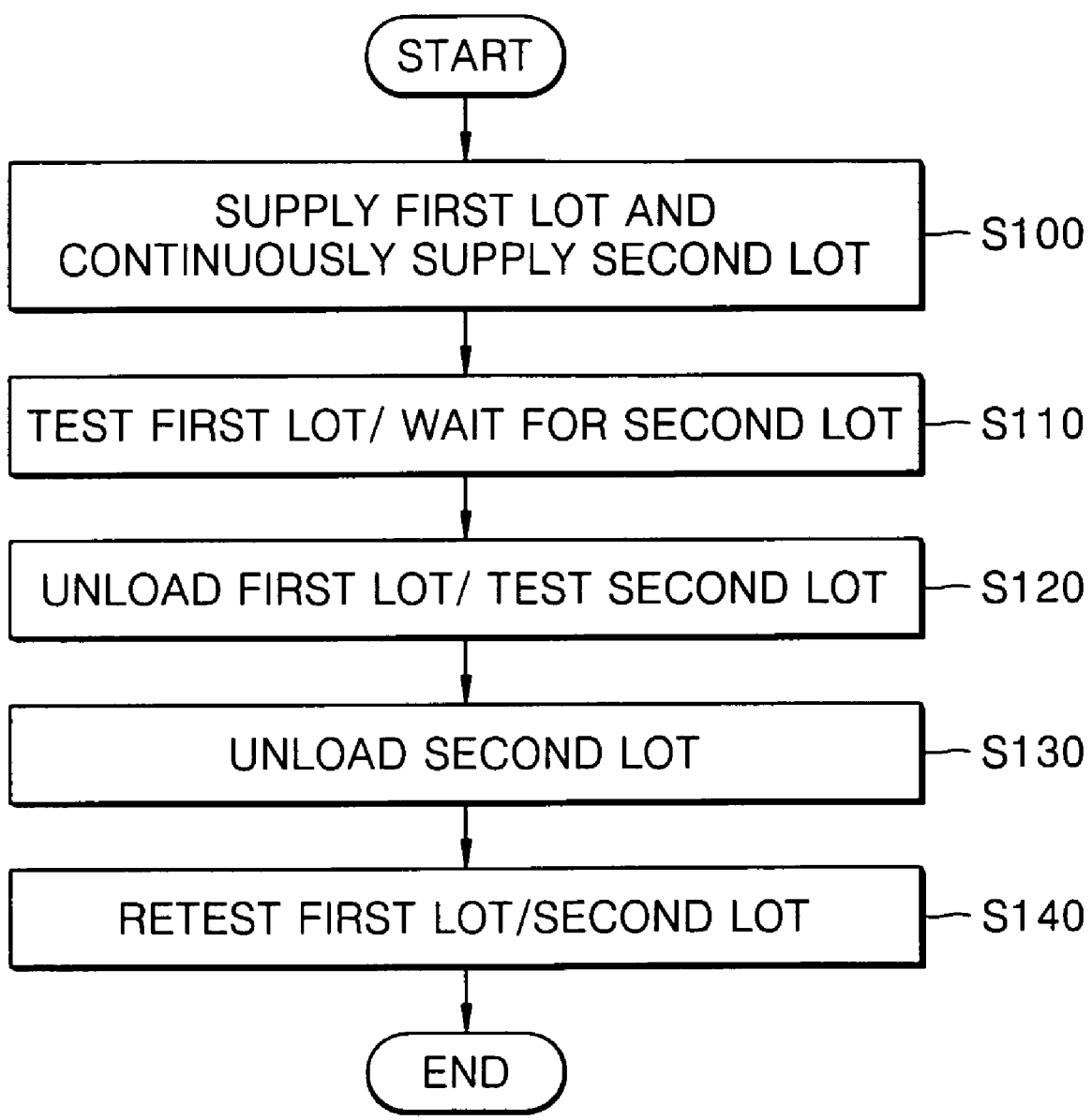
FIG. 6 is a flowchart illustrating a method of electrically testing a plurality of lots using a handler and a tester according to an example embodiment.

FIG. 6 is a flowchart illustrating a method of electrically testing a plurality of lots according to an example embodiment. Referring to FIG. 6, a first lot and a second lot may be continuously supplied to a handler in operation S100. When the first lot is connected to a tester and a test is performed, the second lot may be kept inside the handler in operation S110. When sorting and unloading of the first lot is performed, an electrical test may be simultaneously performed on the second lot in operation S120. The second lot may be unloaded in operation S130, and in operation S140, defective semiconductor devices of the first and second lots may be immediately retested by repeating operations S100 to S130 thereon. As a result, operating efficiency of the tester may be improved.

Figure 7:
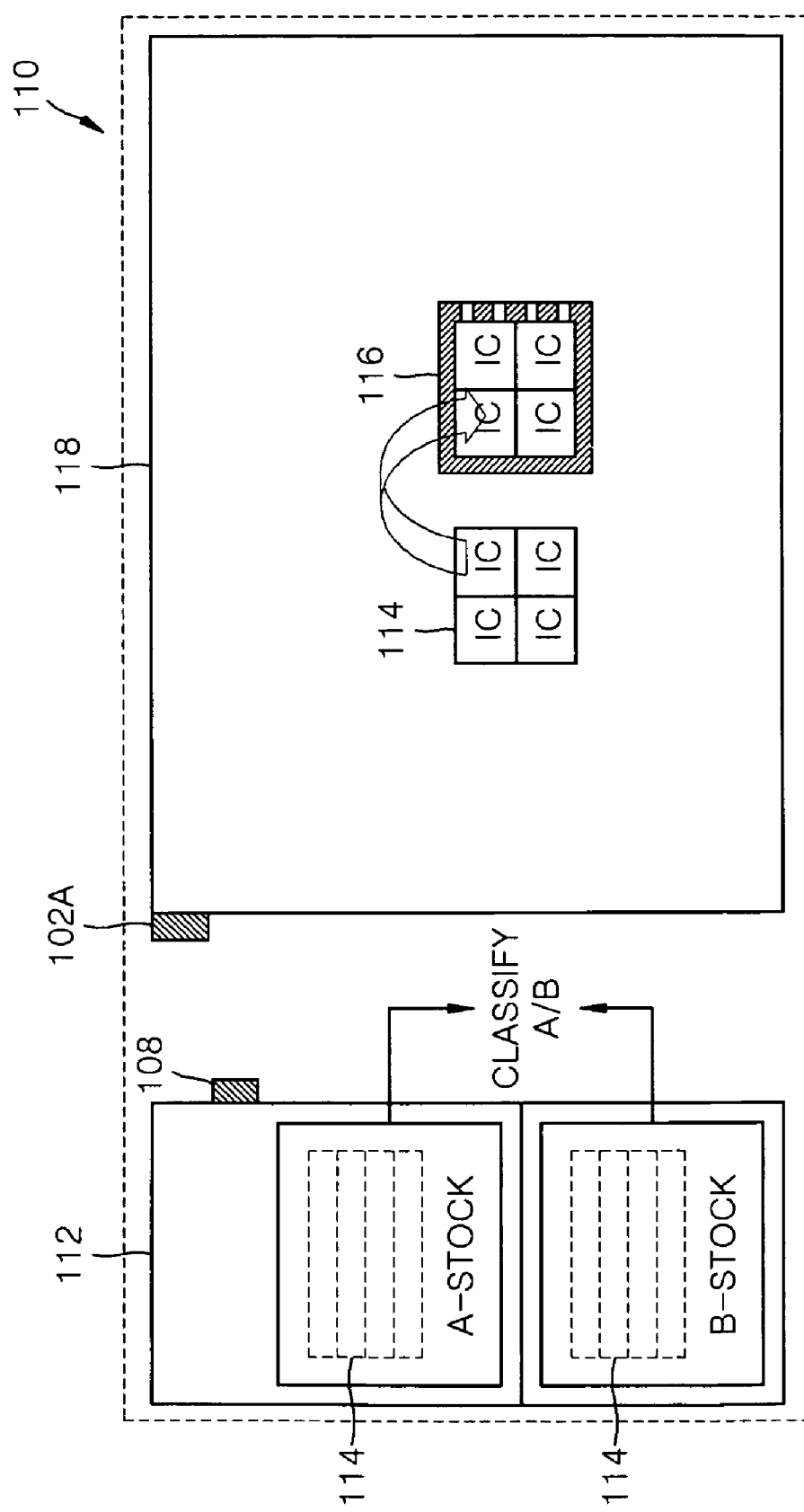
FIG. 7 is an example detailed block diagram of a loader of a handler of FIG. 4.

FIG. 7 is a detailed block diagram of a loader portion of a handler according to an example embodiment. Referring to FIG. 7, a loader portion 110 of a handler 100 may include a receiving space 112 and a tray-conveying site 118. The receiving space 112 may include a space where at least two lots of semiconductor devices may be received. Thus, semiconductor devices in one lot in a customer tray 114 may be received at a-stock, and semiconductor devices in another lot in the customer tray 114 may be received at b-stock. In other words, lots of the semiconductor devices may be sorted in the receiving space 112. Because a sensor 108 may be located in the receiving space 112, a sensor 108 may sense the states of the customer trays 114 containing the lots according to a receiving space 112. If only one lot is supplied, an electrical test may be performed regardless of the empty receiving space.

The tray-conveying site 118 may convey the semiconductor devices in the customer tray 114 to a test tray 116. A first identification information reading unit 102A may be located in the tray-conveying site 118. An identification number may be allocated to each test tray 116. The semiconductor devices in the customer tray 114 may be conveyed to the test tray 116, and the identification information shown in Table 1 may be used to identify the test tray 116 and may be stored in a memory of the handler. The identification information may be transmitted to an external server.

Figure 8:
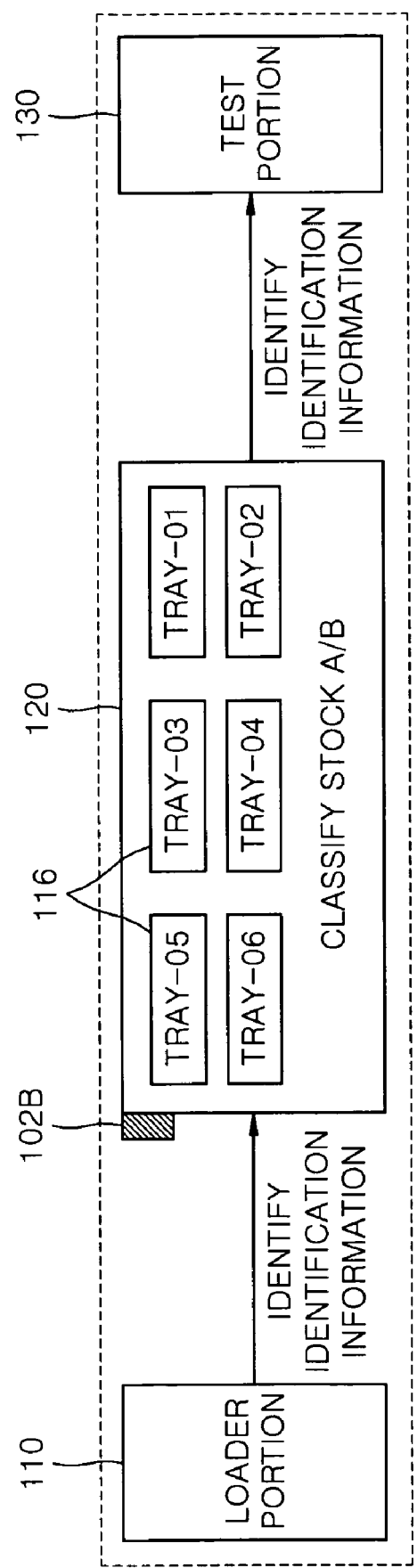
FIG. 8 is an example detailed block diagram of a soak portion of a handler of FIG. 4.

FIG. 8 is a detailed block diagram of a soak portion of a handler according to an example embodiment. Referring to FIG. 8, a soak portion 120 of a handler 100 may be disposed between a loader portion 110 and a test portion 130. The soak portion 120 may raise or lower temperature conditions to the semiconductor devices by a desired amount so as to perform high and low temperature tests.

A second identification information identifying unit 102B may be located at the soak portion 120 and read the identification information according to receiving space identification numbers stock a/b by identifying the identification number of test trays 116. The semiconductor devices to which the temperature conditions have been applied may be conveyed from the soak portion 120 to a test portion 130. The handler 100 may read identification information of a test tray 116 conveyed to the test portion 130 and store the identification information in a memory. The test tray 116 conveyed to the test portion 130 from the soak portion 120 may be processed in a first in first out (FIFO) format.

Figure 9:
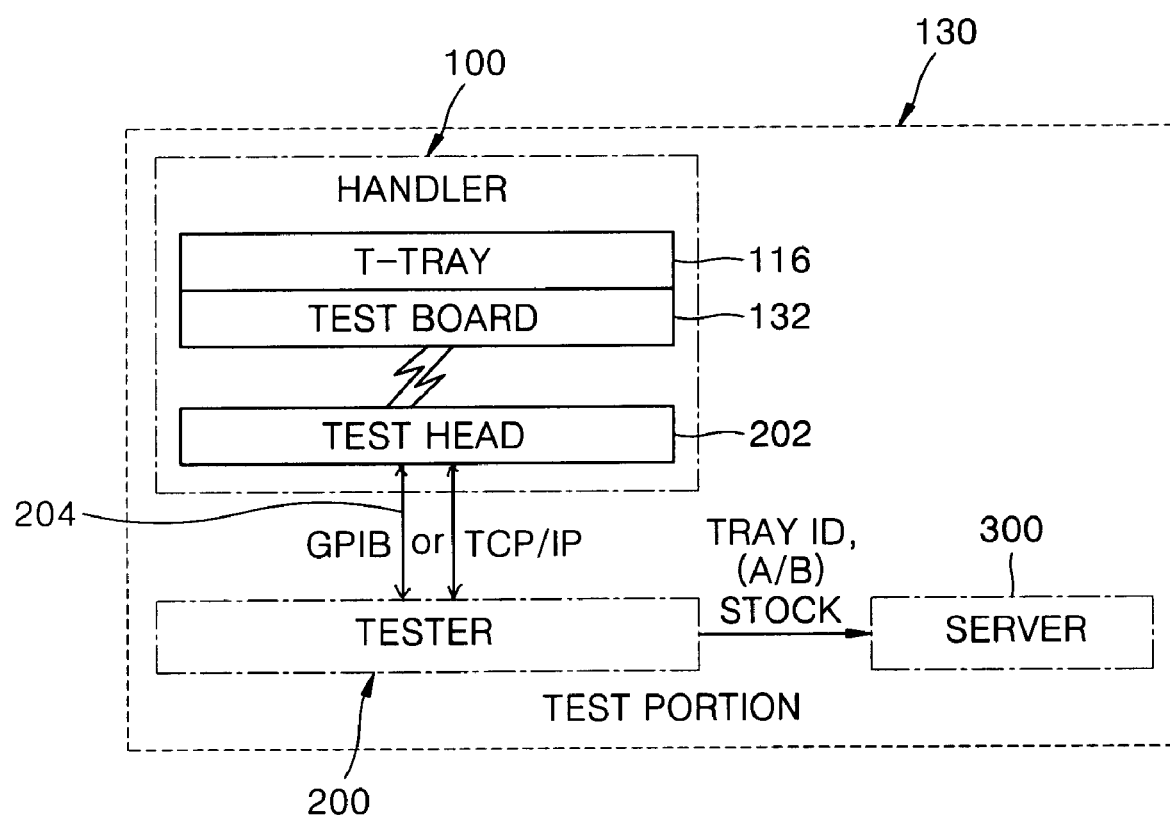
FIG. 9 is an example detailed block diagram of a test portion of a handler of FIG. 4.

FIG. 9 is a detailed block diagram of a test portion 130 of a handler according to an example embodiment. Referring to FIG. 9, when a test tray 116 is in a test portion 130, the test tray 116 may be connected to a test head 202 via a test board 132, and various electrical signals may be applied to semiconductor devices in the test tray 116 by a tester 200.

The electrical signals may be applied and received via a general purpose interface bus (GPIB) communication line or a transmission control protocol/Internet protocol (TCP/IP) communication line. Thus, the handler 100 and the tester 200 may share identification information shown in Table 1 via a communication line 204. Information regarding the test tray 116 and information regarding a receiving space may be transmitted to a server 300 whenever a test on the shared identification information is performed.

In addition, a switch (not shown) may be located at each of the test boards 132 to allocate identification numbers to the test boards 132. The tester 200 may recognize the identification numbers of the test boards 132, which may be stored in a test head 202, and store the identification numbers of the test boards 132 in the tester 200. After a single electrical test is finished, the tester 200 and the server 300 may store the lot number on which the electrical test has been performed, the identification numbers of the test trays 116, the identification numbers of the test boards 132, the quantity of the test trays 116 tested, the test results of coordinates, and the test results of sockets on the test board 132. The test results of coordinates on the test tray 116 and the test result of sockets on the test board 132 may be obtained when a parallel electrical test is performed.

Figure 10:
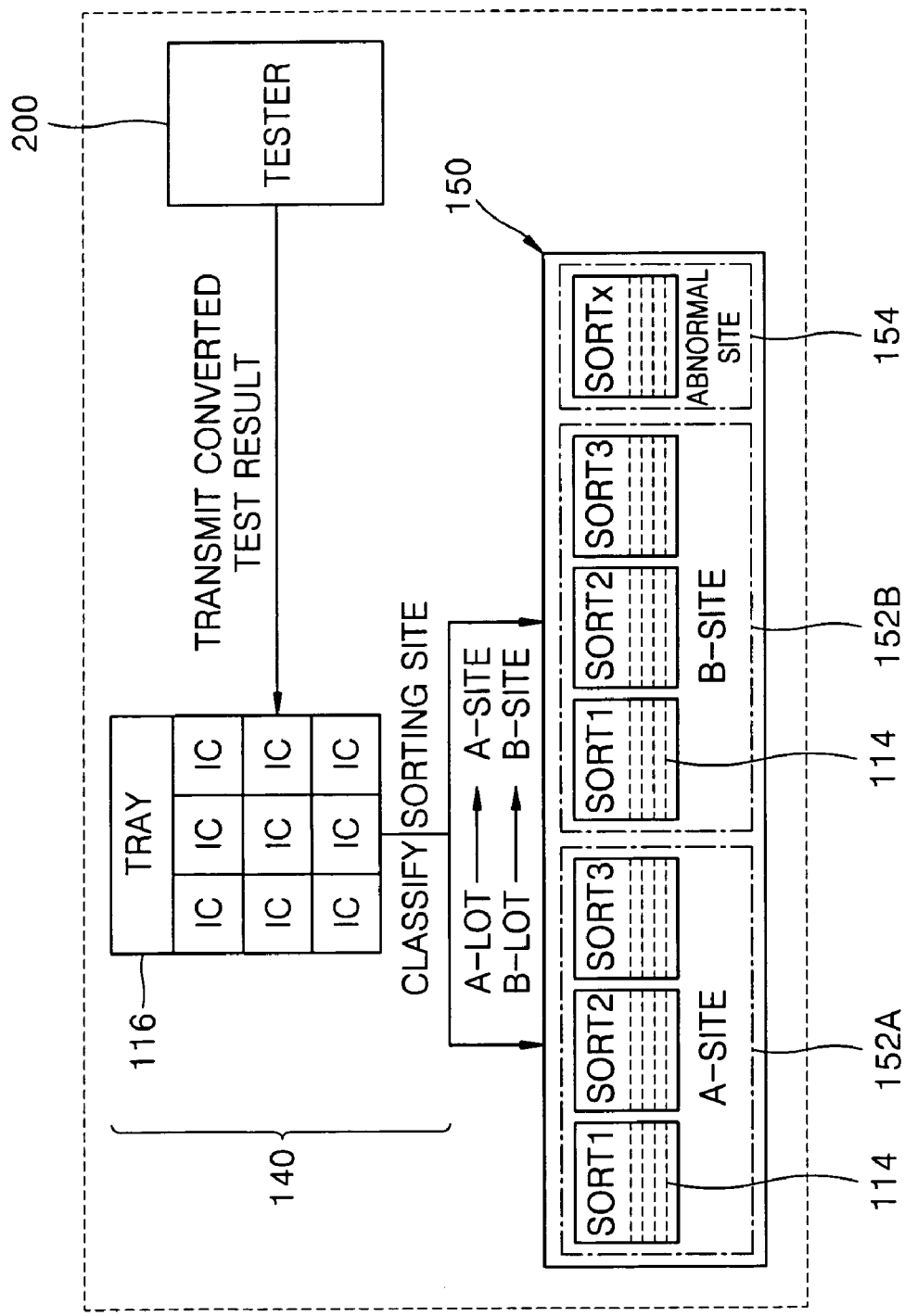
FIG. 10 is an example detailed block diagram of a sorting portion and an unloading portion of a handler of FIG. 4.

FIG. 10 is a detailed block diagram of a sorting portion and an unloading portion of a handler according to an example embodiment. Referring to FIG. 10, a tester 200 may receive test results of each DUT and receiving space information corresponding to identification information from a server 300 to convert the test results. The sorting portion 140 of the handler 100 may substantially sort the DUTs, sort sorting space A/B-sites, and simultaneously convey semiconductor devices from a test tray 116 to a customer tray 114, which then travels to an unloading portion 150. The unloading unit may sort receiving sites 152A and 152B. As shown in FIG. 10, a first lot (A-lot) may be stacked in the receiving site 152A (A-site) and a second lot (B-lot) may be stacked in the receiving site 152B (B-site).

Simultaneously, defective semiconductor devices of which identification information of the test tray 116 may have been lost due to rebooting of a handler or due to a mechanical defect, for example, a jam, may be separately stored in an abnormal material keeping site 154.

Figure 11:
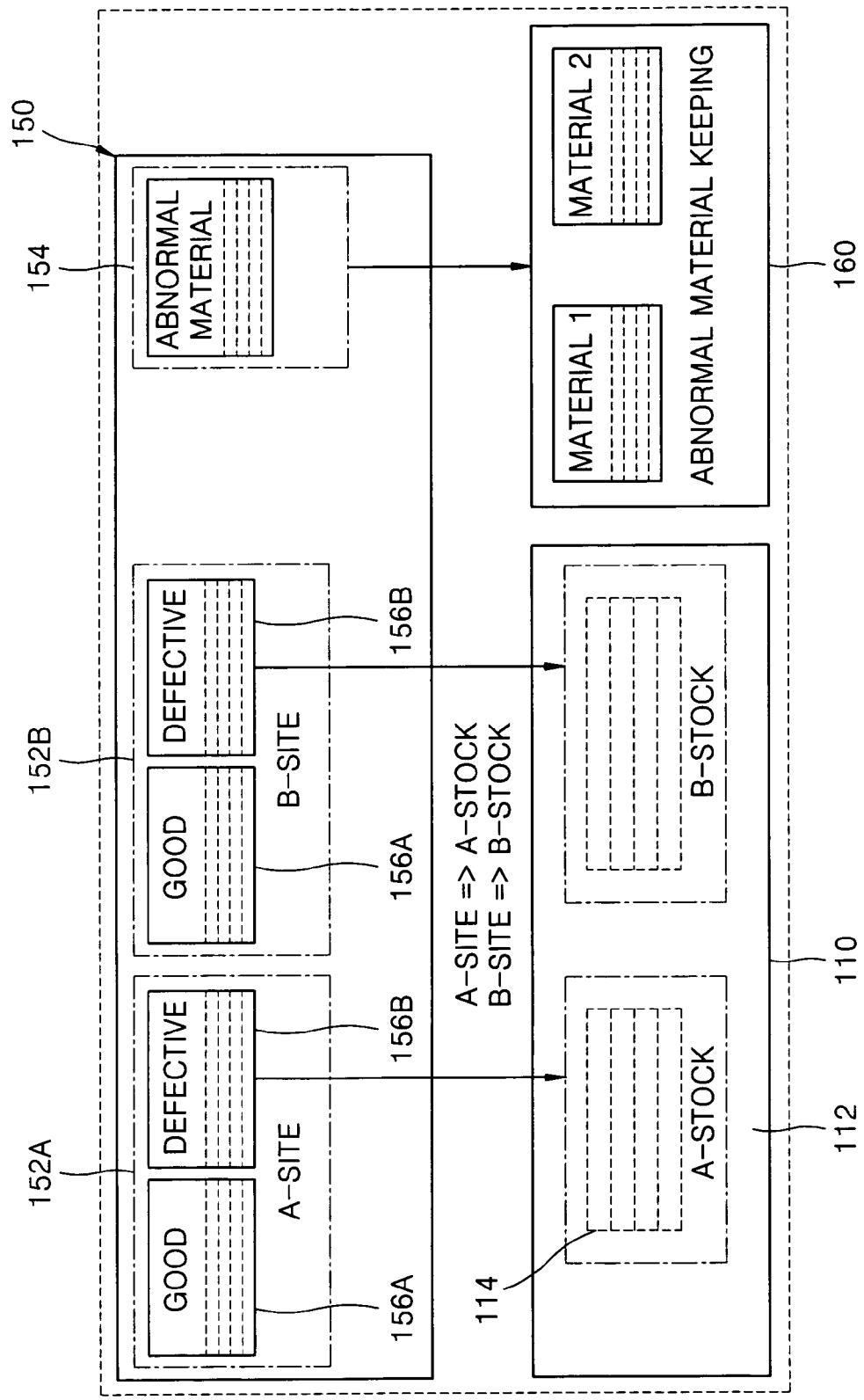
FIG. 11 is an example detailed block diagram of a retest portion and an unloader of the handler of FIG. 4.

FIG. 11 is a block diagram for illustrating a retest performed in an unloader of a handler according to an example embodiment. Referring to FIG. 11, semiconductor devices conveyed from an unloading portion 150 in which receiving spaces may be sorted according to lots may be sorted into "good" semiconductor devices 156A and "defective" semiconductor devices 156B in corresponding sites. The defective semiconductor devices 156B may be reloaded into a receiving space 112 of a designated loader 110 and retested. In the retest process, the above-described testing method may be repeated. The defective semiconductor devices 156B may be inserted in a customer tray 114 as in a first stage, and re-supplied to a loader 10.

The semiconductor devices stored at the abnormal material keeping site 154 of the unloading portion 150 may be released and conveyed to a desired abnormal material keeping site 160.

As described above, in a method of continuously electrically testing semiconductor devices by identifying a lot and a test tray according to example embodiments, a plurality of lots may be continuously electrically tested, sorted and retested without an addition of new hardware to the handler such that the operating efficiency of a tester may be improved and the productivity of the entire electrical testing process may be improved, and the number of testers may be reduced, thereby reducing production costs.

While example embodiments have been particularly shown and described, it will be understood by those of ordinary skill in the art that various changes in form and details may be made therein without departing from the scope of the appended claims.

What is claimed is:

1. A method of testing semiconductor devices comprising:
   loading a plurality of semiconductor devices, in at least two lots, into a handler;
   conveying a first lot of the plurality of semiconductor devices to a test tray;
   reading identification information of the conveyed first lot to store the identification information in the handler;
   transmitting the identification information to an external server;
   performing an electrical test on the conveyed first lot using the identification information stored in the handler;
   receiving the identification information from the external server and converting the electrical test results, wherein converting the electrical test results includes:
   designating receiving space numbers to each of the plurality of semiconductor devices of the first lot;
   sorting and loading the tested semiconductor devices of the first lot based on the converted electrical test results; and
   performing the electrical test on a second lot of the plurality of semiconductor devices.

2. The method of claim 1, wherein when the first lot of the plurality of semiconductor devices is sorted, the second lot of the plurality of semiconductor devices is electrically tested.

3. The method of claim 1, wherein the electrical test performed on the semiconductor devices included in the lots is a test program at fixed temperatures.

4. The method of claim 1, wherein the identification information includes test tray identification numbers.

5. The method of claim 1, wherein the identification information includes time information indicating a time required to convey the lot of the plurality of semiconductor devices from a customer tray to the test tray.

6. The method of claim 1, wherein the identification information includes a number of semiconductor devices contained on the test tray.

7. The method of claim 1, wherein reading the identification information is performed by a bar-code recognizer, a sensor, or a radio frequency identification (RFID) device.

8. The method of claim 1, wherein converting the electrical test results uses a value corresponding to a maximum value of bin data, wherein the bin data is used to classify the plurality of semiconductor devices.

9. The method of claim 1, wherein after unloading the first or second lots of the plurality of semiconductor devices, performing a retest on semiconductor devices found to be defective during the electrical test.

10. The method of claim 9, wherein a third lot of the plurality of semiconductor devices is loaded while the retest on the defective semiconductor devices is performed.

11. The method of claim 1, further comprising:
    converting the second electrical test results, wherein converting the second electrical test results includes designating receiving space numbers to each of the plurality of semiconductor devices of the second lot.

* * * * *